(12) United States Patent
Yang et al.

(10) Patent No.: US 10,777,635 B2
(45) Date of Patent: Sep. 15, 2020

(54) DISPLAY SUBSTRATE, METHOD FOR MANUFACTURING THE SAME AND DISPLAY DEVICE

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventors: Fan Yang, Beijing (CN); Kun Guo, Beijing (CN); Jie Pu, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

(*) Notice: Subject to any disclaimer, the term of this patent is extended or adjusted under 35 U.S.C. 154(b) by 75 days.

(21) Appl. No.: 15/777,704

(22) PCT Filed: Nov. 7, 2017

(86) PCT No.: PCT/CN2017/109739
§ 371 (c)(1),
(2) Date: May 21, 2018

(87) PCT Pub. No.: WO2018/214409
PCT Pub. Date: Nov. 29, 2018

(65) Prior Publication Data
US 2019/0355801 A1 Nov. 21, 2019

(30) Foreign Application Priority Data
May 26, 2017 (CN) .......................... 2017 1 0386834

(51) Int. Cl.
*H01L 27/32* (2006.01)

(52) U.S. Cl.
CPC ...... *H01L 27/3279* (2013.01); *H01L 27/3246* (2013.01); *H01L 2227/323* (2013.01)

(58) Field of Classification Search
CPC ............. H01L 51/0012; H01L 27/3276; H01L 27/3279; H01L 51/0011
See application file for complete search history.

(56) References Cited

U.S. PATENT DOCUMENTS 6,288,454 B1 * 9/2001 Allman ................... G03F 9/708
257/623
2018/0190672 A1 * 7/2018 Lee ...................... H01L 25/0753

FOREIGN PATENT DOCUMENTS

CN 102707486 A 10/2012
CN 104868058 A 8/2015
(Continued)

OTHER PUBLICATIONS

PCT International Search Report, Application No. PCT/CN2017/109739, dated Feb. 13, 2018, 9 pages: with English translation.
(Continued)

*Primary Examiner* — Cuong Q Nguyen
*Assistant Examiner* — Shih Tsun A Chou
(74) *Attorney, Agent, or Firm* — Armstrong Teasdale LLP

(57) ABSTRACT

Embodiments of the present disclosure provide a display substrate, a method for manufacturing the same, and a display device, and relate to the field of display technology. The contact area between a first conductive pattern and a second conductive pattern may be increased. The display substrate includes a display area and a peripheral area surrounding the display area. The peripheral area includes a first conductive pattern including at least two first hollow areas as alignment marks, an insulation layer disposed on the first conductive pattern, the insulation layer including a first insulating pattern, the first insulating pattern covering the first hollow area, and the first insulating pattern being (Continued)

incompletely covering space between adjacent first hollow areas, a second conductive pattern disposed on the insulating layer, the second conductive pattern penetrating through the hollow area on the first insulating pattern and electrically connected to the first conductive pattern.

16 Claims, 7 Drawing Sheets

(56) References Cited

FOREIGN PATENT DOCUMENTS

| CN | 107170785 A | 9/2017 |
|---|---|---|
| TW | 201602851 A | 1/2016 |

OTHER PUBLICATIONS

PCT Written Opinion, Application No. PCT/CN2017/109739, dated Feb. 13, 2018, 5 pages.: with English translation of relevant part.

* cited by examiner

| forming a third conductive pattern on the base substrate, the third conductive pattern comprising a first conductive pattern in the peripheral area, wherein the first conductive pattern comprises at least two first hollow areas, and the first hollow area is used as an alignment mark | — S100 |

| forming a third insulating pattern on the third conductive pattern, the third insulating pattern comprises a first insulating pattern located in the peripheral area, wherein the first insulating pattern covers the first hollow area, and the first insulation the pattern does not completely cover the space between the adjacent first hollow areas | — S101 |

| forming a fourth conductive pattern on the third insulating pattern, the fourth conductive pattern comprising a second conductive pattern in the peripheral area, wherein the second conductive pattern is electrically connected to the first conductive pattern, and the second electrode covers the display area | — S102 |

FIG.9

DISPLAY SUBSTRATE, METHOD FOR MANUFACTURING THE SAME AND DISPLAY DEVICE

CROSS REFERENCE TO RELATED APPLICATIONS

This patent application is a National Stage Entry of PCT/CN2017/109739 filed on Nov. 7, 2017, which claims the benefit and priority of Chinese Patent Application No. 201710386834.4 filed on May 26, 2017, the disclosures of which are incorporated herein by reference in their entirety as a part of the present application.

BACKGROUND

The present disclosure relates to the field of display technology, and in particular, to a display substrate, a method for manufacturing the same, and a display device.

With the rapid development of display technology, the development of displays has presented a trend of high integration and low cost in recent years. Currently, more and more displays use the gate driver on array (GOA) technology. The GOA technology integrates the gate driver circuit on the array substrate to eliminate the need to set an additional drive, such as Chip On Film (COF), on an edge of the array substrate, facilitates the miniaturization of the array substrate, and reduces the cost of the product from both the material cost and the manufacturing process cost.

BRIEF DESCRIPTION

Embodiments of the present disclosure provide a display substrate, a method for manufacturing the same, and a display device and can increase a contact area of a first conductive pattern and a second conductive pattern.

To achieve the above purpose, the embodiments of the present disclosure adopt the following technical solutions:

A first aspect of the present disclosure provides a display substrate. The display substrate includes a display area and a peripheral area surrounding the display area. The peripheral area includes a first conductive pattern including at least two first hollow areas as alignment marks, an insulating layer is disposed on the first conductive pattern, the insulating layer including a first insulating pattern, the first insulating pattern covering the first hollow area, wherein the first insulating pattern does not completely cover space between adjacent first hollow areas, and a second conductive pattern disposed on the insulating layer, the second conductive pattern being electrically connected to the first conductive pattern.

The first insulating pattern may have a zigzag shape.

The first insulating pattern may include a plurality of mutually independent sub-insulating patterns, and each sub-insulating pattern covers one first hollow area.

Further a projection of a boundary of the sub-insulating pattern on the first conductive pattern may overlap with a boundary of the first hollow area.

The first conductive pattern may surround the display area along an entire periphery of the display area.

The first conductive pattern may further include a second hollow area, and wherein the second hollow area and the first hollow area are located on different sides of the display area, the insulation layer further includes a second insulating pattern, wherein the second insulating pattern covers the second hollow area.

The display area may include a pixel defining layer disposed on the base substrate, a first electrode, a light emitting layer, and a second electrode covering the display area disposed in sequence in an opening of the pixel defining layer, the first conductive pattern is disposed in the same layer as the first electrode, and the second conductive pattern is disposed in the same layer as the second electrode.

The first insulating pattern may be disposed in the same layer as the pixel defining layer.

The display area may further include a spacer disposed on the pixel defining layer and between the pixel defining layer and the second electrode, the first insulating pattern is disposed in the same layer as the spacer.

The insulating layer may further include a second insulating pattern, the second insulating pattern being disposed in the same layer as the pixel defining layer.

The display area may further include a spacer, the spacer being located between the pixel defining layer and the second electrode.

A second aspect of the present disclosure provides a display device including the display substrate described above.

A third aspect of the present disclosure provides a method for fabricating a display substrate. The display substrate including a display area and a peripheral area surrounding the display area, wherein the method includes forming a third conductive pattern on the base substrate, the third conductive pattern including a first conductive pattern in the peripheral area, wherein the first conductive pattern includes at least two first hollow areas as alignment marks, forming a third insulating pattern on the third conductive pattern, the third insulating pattern includes a first insulating pattern located in the peripheral area, wherein the first insulating pattern covers the first hollow area, and the first insulation pattern does not completely cover the space between the adjacent first hollow areas, forming a fourth conductive pattern on the third insulating pattern, the fourth conductive pattern including a second conductive pattern in the peripheral area, wherein the second conductive pattern is electrically connected to the first conductive pattern, and the second electrode covers the display area.

The third conductive pattern may further include a first electrode located in the display area, the third insulating pattern further includes a pixel defining layer or spacer located in a pixel defining area of the display area, the fourth conductive pattern further includes a second electrode located in the display area.

The first insulating pattern may have a zigzag shape.

The first insulating pattern may include a plurality of mutually independent sub-insulating patterns, wherein each sub-insulating pattern covers one first hollow area.

Further a projection of a boundary of the sub-insulating pattern on the first conductive pattern may coincide with a boundary of the first hollow area.

The first conductive pattern may surround the display area along the entire periphery of the display area.

BRIEF DESCRIPTION OF THE DRAWINGS

In order to more clearly describe the embodiments of the present disclosure or the technical solutions in the prior art, the drawings used in the description of the embodiments or the prior art will be briefly described below, the drawings in the following description. It is merely some embodiments of the present disclosure and those skilled in the art can obtain other drawings based on these drawings without any creative work.

FIG. 9 is a schematic flow chart of a method for manufacturing a display substrate provided by an embodiment of the present disclosure.

DETAILED DESCRIPTION

The following clearly describes the technical solutions in the embodiments of the present disclosure with reference to the accompanying drawings in the embodiments of the present disclosure. It is obvious that the described embodiments are merely some but not all of the embodiments of the present disclosure. All other embodiments obtained by persons of ordinary skill in the art based on the embodiments of the present disclosure without creative efforts shall fall within the protection scope of the present disclosure.

When introducing elements of the present disclosure and the embodiments thereof, the articles "a," "an," "the," and "said" are intended to mean that there are one or more of the elements. The terms "comprising," "including," "containing," and "having" are intended to be inclusive and mean that there may be additional elements other than the listed elements.

For the purposes of the following surface description, the terms "upper", "lower", "left", "right", "vertical", "horizontal", "top", "bottom", and its derivatives should involve the disclosure. The terms "overlying", "on top of", "positioned on" or "positioned on top of" mean that a first element such as a first structure exists in a second element such as a second structure, wherein, there may be an intermediate element such as an interface structure between the first element and the second element. The term "contact" means connecting a first element such as a first structure and a second element such as a second structure, and there may or may not be other elements at the interface of the two elements.

Figure 1:
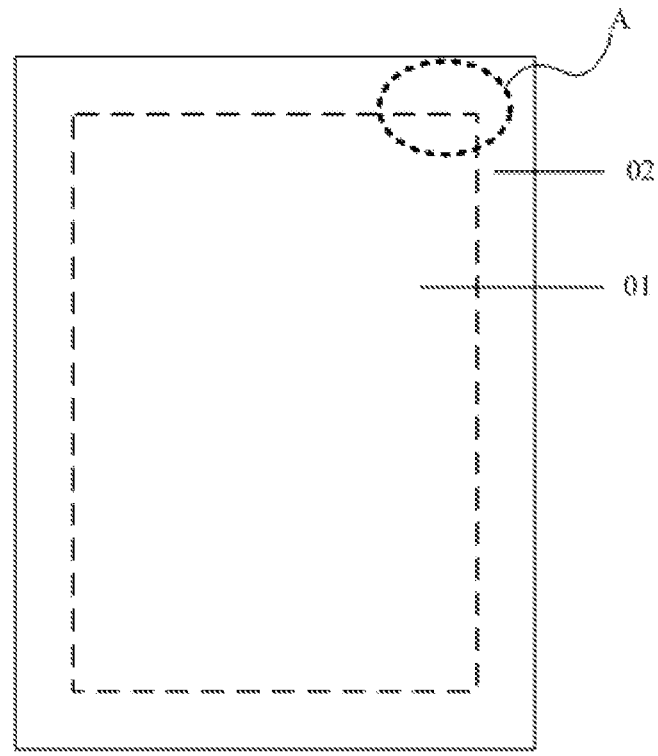
FIG. 1 is a schematic structural diagram of a display substrate divided into a display area and a peripheral area according to the prior art.
Figure 2:
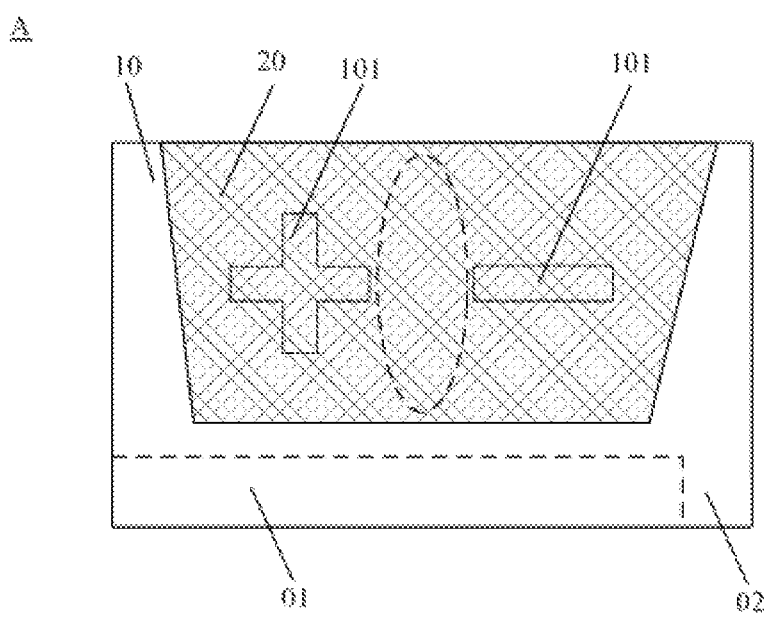
FIG. 2 is an enlarged schematic view of A in FIG. 1 provided by the prior art.

As shown in FIG. 1, a display substrate such as an OLED (Organic Electro-Electroluminescent Display) includes a display area (also referred to as an AA area, i.e., an active area) 01 and a peripheral area 02 surrounding the display area 01. The peripheral area 02 is used for setting a driver IC (Integrated Circuit) or a GOA circuit. In case of the peripheral area 02 includes a GOA circuit, as shown in FIG. 2, the peripheral area 02 includes a first conductive pattern 10 and a second conductive pattern arranged in a stack. For example, the first conductive pattern 10 and the second conductive pattern may be electrically connected to be used as a portion of a GOA circuit (the second conductive pattern is not illustrated in FIG. 2 of the present disclosure). Wherein, the first conductive pattern 10 is provided with a plurality of first hollow areas 101 for use as an alignment mark for facilitating alignment in subsequent processes. Since the edge of the first hollow area 101 is apt to be oxidized to form a burr, in order to prevent oxidation of the edge of the first hollow area 101, a first insulating pattern 20 is generally formed on the first conductive pattern 10 in the prior art, wherein the first insulating pattern 20 covers the first hollow area 101.

However, as shown in FIG. 2, the first insulating pattern 20 in the prior art not only covers the first hollow area 101, but also covers a portion between adjacent first hollow areas 101 (as shown in a dotted circle in FIG. 2) so that when the second conductive pattern is formed on the first insulating pattern 20, the overlapping area of the first conductive pattern 10 and the second conductive pattern is reduced, thereby making the resistance between the first conductive pattern 10 and the second conductive pattern is large leading to poor display effect.

Figure 6:
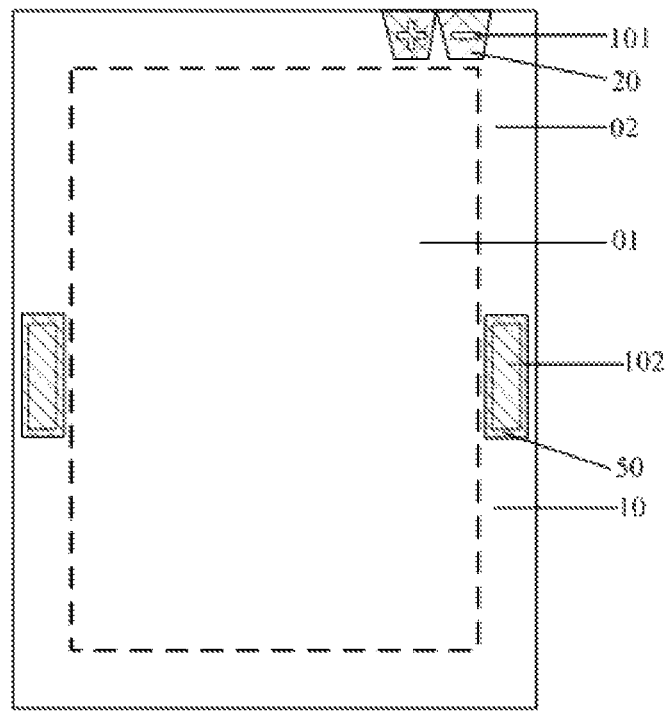
FIG. 6 is a schematic structural diagram of a display substrate provided by an embodiment of the present disclosure.

An embodiment of the present disclosure provides a display substrate, as shown in FIGS. 1 and 6, including a display area 01 and a peripheral area 02, wherein the peripheral area 02 may be provided with a driving circuit, a Gate-Reset GOA, or an EM GOA Etc. There are no restrictions on this.

As shown in FIG. 3A to FIG. 6, the peripheral area 02 includes a first conductive pattern 10, the first conductive pattern 10 includes at least two first hollow areas 101, and the first hollow area 101 is used as an alignment mark, an insulation layer on the first conductive pattern 10, the insulation layer includes a first insulating pattern 20, the first insulating pattern 20 covers the first hollow area 101, and the first insulating pattern 20 does not completely cover the space between adjacent first hollow areas 101, a second conductive pattern 30 disposed on the insulating layer, the second conductive pattern 30 being electrically connected to the first conductive pattern 10.

The first conductive pattern 10, the first insulating pattern 20, and the second conductive pattern 30 are illustrated in FIGS. 3A and 3B, and FIGS. 3C, 3D, and 4-6 only show the first conductive pattern 10 and the first insulating pattern 20 and does not illustrate the second conductive pattern 30.

It should be noted that, first, the shape of the first hollow area 101 on the first conductive pattern 10 is not limited. Since the first hollow area 101 is used as an alignment mark, the first hollow area 101 is generally set to the shape of a "+" or "−" symbol. On this basis, the number of the first hollow areas 101 is not limited, and corresponding settings may be made as needed. Two first hollow areas 101 may be provided, or a plurality of first hollow areas 101 may be provided.

Wherein, the display substrate has a region (as shown in FIG. 1 at position A) dedicated to setting the alignment mark, which is referred to as an alignment mark area, and the first hollow area 101 is used as an alignment mark, and thus the first hollow area 101 is set in the alignment mark area. The display substrate may have one, two or more alignment mark areas. In this embodiment of the present disclosure, an example with one alignment mark area is used as an example.

Secondly, the first insulating pattern 20 does not completely cover the space between the adjacent first hollow areas 101. A portion of the first insulating pattern 20 located between the adjacent first hollow areas 101 may be hollow or discontinuous. The shape of the first insulating pattern 20 is not limited as long as the first insulating pattern 20 covers the first hollow area 101 and does not completely cover the space between the adjacent first hollow areas 101.

Thirdly, the first conductive pattern 10 and the second conductive pattern 30 in the peripheral area 02 may be formed simultaneously with the film layer in the display area 01, or may be separately fabricated. The shape of the first conductive pattern 10 and the second conductive pattern 30 may be or may not be the same. In the embodiments of the present disclosure, preferably, the first conductive pattern 10 and the second conductive pattern 30 are of the same shape and size, and the second conductive pattern 30 covers the first conductive pattern 10.

On this basis, the first conductive pattern 10 and the second conductive pattern 30 are disposed in the peripheral area 02, and the first conductive pattern 10 and the second conductive pattern 30 are electrically connected, so that the signals of the display area 01 can be transmitted layer by layer to transmit the signal of the display area 01 to the driver IC or other circuit in the peripheral area 02. Alternatively, if the display substrate is a COA substrate, the first conductive pattern 10 and the second conductive pattern 30 are electrically connected and can be used as part of a GOA circuit.

An embodiment of the present disclosure provides a display substrate with the first insulating pattern 20 of the peripheral area 02 of the embodiment does not completely cover the space between the adjacent first hollow areas 101, compared with a display substrate in the prior art of which the first insulating pattern 20 covers both the first hollow area 101 and the space between adjacent first hollow areas, the contact area between the first conductive pattern 10 and the second conductive pattern 30 of the embodiments in the present disclosure may be increased, the contact resistance between the first conductive pattern 10 and the second conductive pattern 30 is reduced. Thus, the problem of non-uniform resistance due to the first insulating pattern 20 is reduced, and voltage drop in a display substrate such as an OLED display substrate is reduced. Technical problems such as optical failure and uneven brightness caused by voltage drop may also be resolved.

As shown in FIGS. 3A, 3C, 3D, and 6, the first insulating pattern 20 may have a zigzag shape.

Figure 3A:
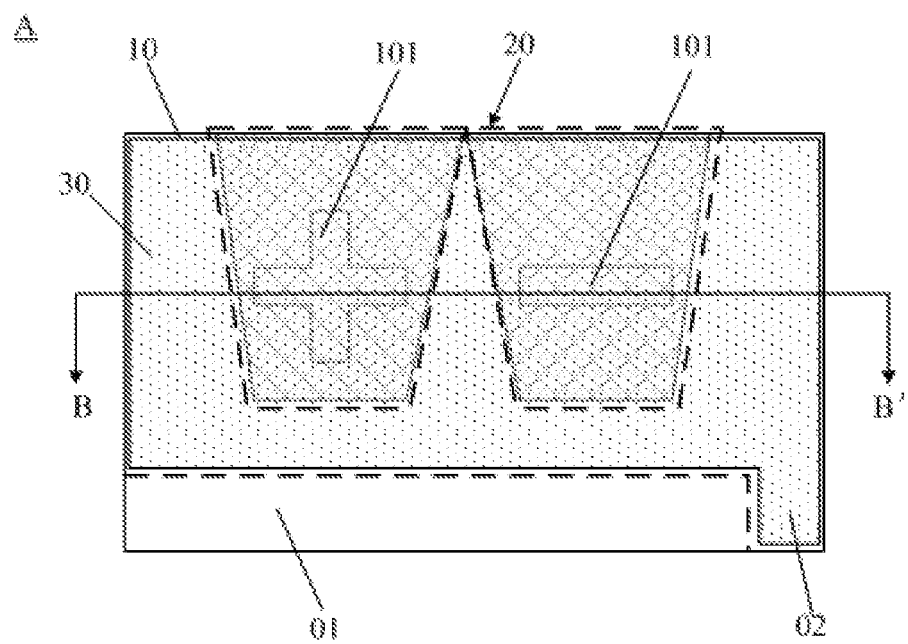
FIG. 3A is a first enlarged schematic view of A of FIG. 1 provided by an embodiment of the present disclosure.
Figure 3B:
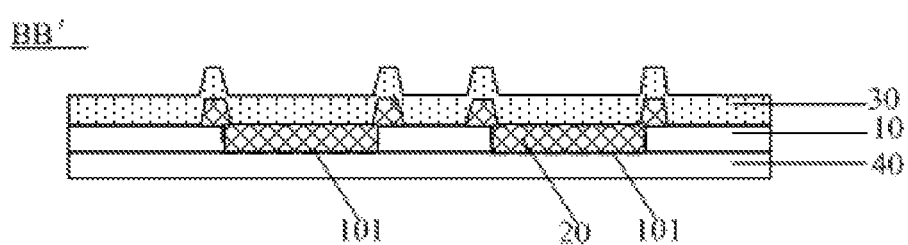
FIG. 3B is a schematic cross-sectional view taken along line BB' of FIG. 3A.
Figure 3C:
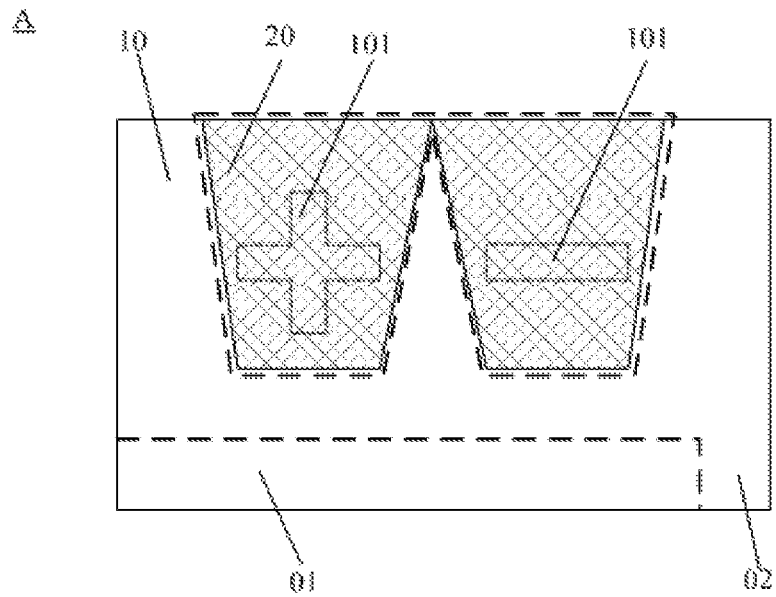
FIG. 3C is a second enlarged schematic view of A in FIG. 1 provided by an embodiment of the present disclosure.
Figure 3D:
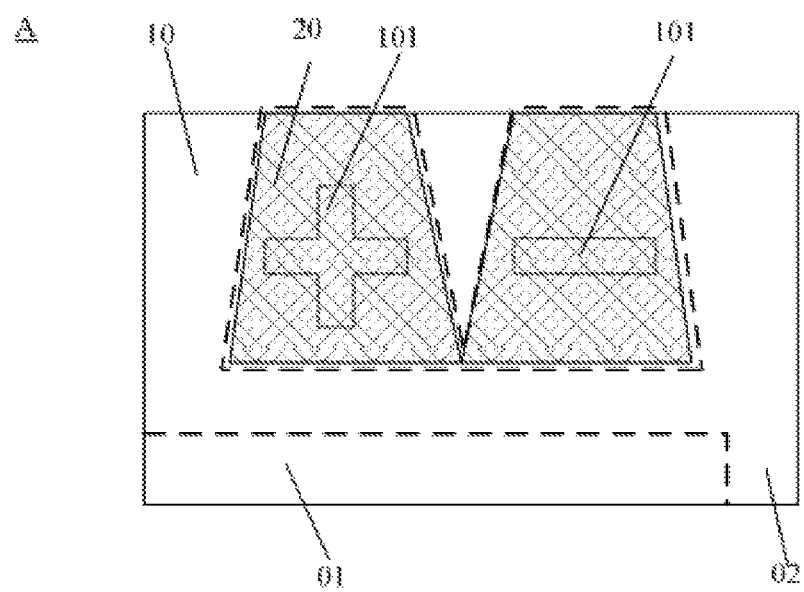
FIG. 3D is a third enlarged schematic view of A of FIG. 1 provided by an embodiment of the present disclosure.

Here, when the first insulating pattern 20 has a zigzag (toothing) shape, one tooth covers one first hollow area 101. In addition, the teeth of the zigzag shape may face towards the display area 01 as shown in FIGS. 3A, 3C, and 6 or may face away from the display area 01 as shown in FIG. 3D.

On this basis, when the shape of the first insulating pattern 20 is zigzag, the tips of the teeth may be dots (not shown in the drawings of the present disclosure), and may also be lines as shown in FIG. 3A, FIG. 3C, FIG. 3D, and FIG. 6.

In the embodiment of the present disclosure, the first insulating pattern 20 covers the first hollow area 101. Since the shape of the first insulating pattern 20 is zigzag, when the second conductive pattern 30 is formed on the first insulating pattern 20, the contact area of the first conductive pattern 10 and the second conductive pattern 30 is increased.

Figure 4:
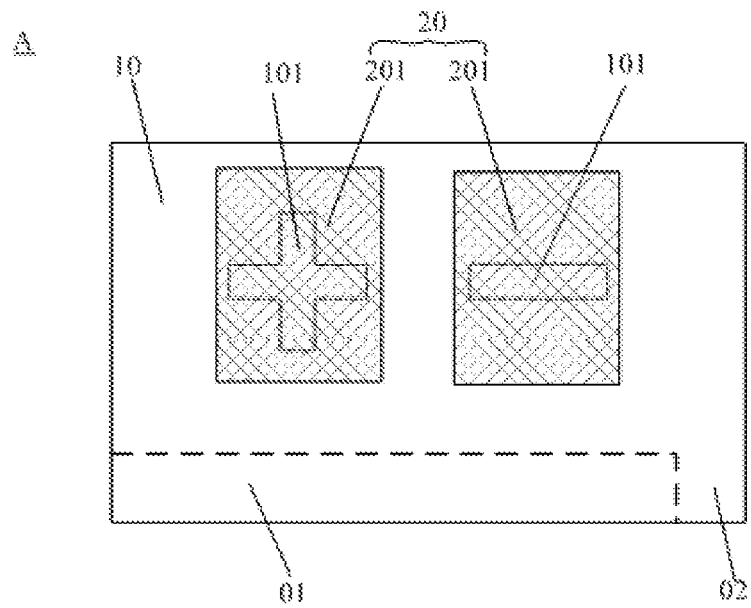
FIG. 4 is a fourth enlarged schematic diagram of A in FIG. 1 provided by an embodiment of the present disclosure.
Figure 5:
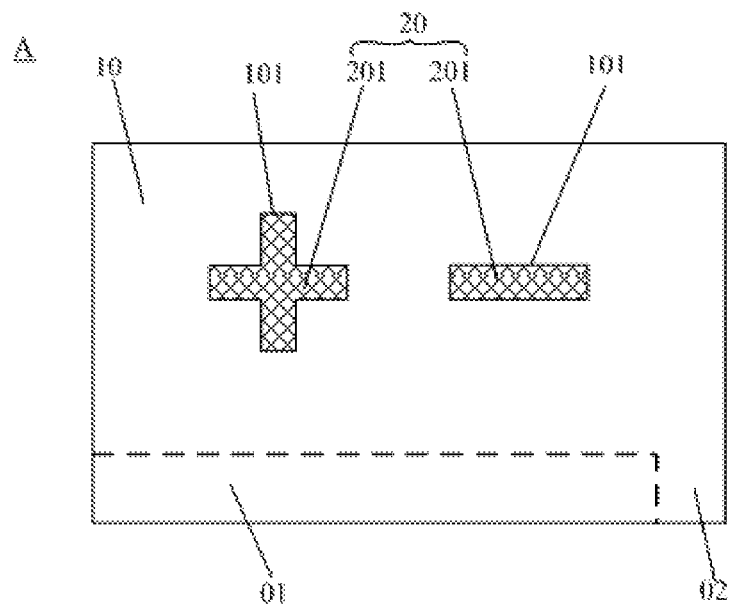
FIG. 5 is a fifth enlarged schematic view of A of FIG. 1 provided by an embodiment of the present disclosure.

As shown in FIG. 4 and FIG. 5 (the second conductive pattern 30 is not illustrated in FIG. 4 or FIG. 5), the first insulating pattern 20 may include a plurality of mutually independent sub-insulating patterns 201, each sub-insulating pattern 201 covers a first hollow area 101.

Wherein, the shape and size of the sub-insulating pattern 201 are not limited as long as each sub-insulating pattern 201 can cover a first hollow area 101. In order to make the contact area of the first conductive pattern 10 and the second conductive pattern 30 as large as possible, the sub-insulating pattern 201 should be as small as possible.

Here, each sub-insulating pattern 201 covers a first hollow area 101. As shown in FIG. 4, the boundary of a projection of the sub-insulating pattern 201 projected on the first conductive pattern 10 may envelope the boundary of the first hollow area 101. As shown in FIG. 5, the boundary of a projection of the sub-insulating pattern 201 projected on the first conductive pattern 10 may overlap with the boundary of the first hollow area 101.

In the embodiment of the present disclosure, since the first insulating pattern 20 includes a plurality of mutually independent sub-insulating patterns 201, each sub-insulating pattern 201 covers one first hollow area 101, such that when the second conductive patterns 30 is formed on the first insulating patterns 20, the contact area of the first conductive pattern 10 and the second conductive pattern 30 can be increased.

In order to maximize the contact area between the first conductive pattern 10 and the second conductive pattern 30 and prevent the edges of the first hollow area 101 in the first conductive pattern 10 from being oxidized to form a burr, embodiments of the present disclosure are further, as shown in FIG. 5, the projection of the boundary of the sub-insulating pattern 201 on the first conductive pattern 10 may coincide with the boundary of the first hollow area 101. At this time, the shape and size of the sub-insulating pattern 201 are completely the same as the size and the shape of the first hollow area 101, and the sub-insulating pattern 201 is filled in the first hollow area 101.

Alternatively, as shown in FIG. 6, the first conductive pattern 10 surrounds the display area 01 along the entire periphery of the display area 01.

In embodiments of the present disclosure, since the first conductive pattern 10 surrounds the display area 01 along the entire periphery of the display area 01, the area of the first conductive pattern 10 increases so that the first conductive pattern 10 and the second conductive pattern 30 are in contact, and the voltage drop between the first conductive pattern 10 and the second conductive pattern 30 can be reduced.

As shown in FIG. 6, the first conductive pattern 10 may further include a second hollow area 102, the second hollow area 102 and the first hollow area 101 are located on different sides of the display area 01, the insulation layer also includes a second insulation pattern 50, wherein the second insulating pattern 50 covers the second hollow area 102.

Here, the material of the first insulating pattern 20 and the material of the second insulating pattern 50 may be the same or different. When the material of the first insulating pattern 20 and the material of the second insulating pattern 50 are not the same, the first insulating pattern 20 may be formed first, and then the second insulating pattern 50 may be formed, or the second insulating pattern 50 may be formed first, and then the first insulating pattern 20 may be formed.

It should be noted that the second conductive pattern 30 not only covers the first insulating pattern 20 but also covers the second insulating pattern 50, and the second conductive pattern 30 is electrically connected to the first conductive pattern 10 through the hollow area on the insulating layer.

Here, the second hollow area 102 may be provided on one side of the display area 01, or the second hollow area 102 may be provided on two sides or three sides of the display area 01.

Based on this, the display area 01 has different sides, and the second hollow area 102 and the first hollow area 101 are located on different sides of the display area 01. Taking FIG. 6 as an example, the display area 01 has four sides: upper side, lower side, left side, and right side. The first hollow area 101 is located on the upper side of the display area 01, and the second hollow area 102 is located on the left and right sides of the display area 01.

In the embodiment of the present disclosure, the first conductive pattern 10 further includes a second hollow area 102. The second hollow area 102 and the first hollow area 101 are located on different sides of the display area 01. A second hollow area 102 is disposed on the first conductive pattern 10 to prevent the first conductive pattern 10 from bubbling. By covering the second insulating area 102 with the second insulating pattern 50, it is possible to prevent the edges of the second hollow area 102 from being oxidized to form burrs.

Figure 7:
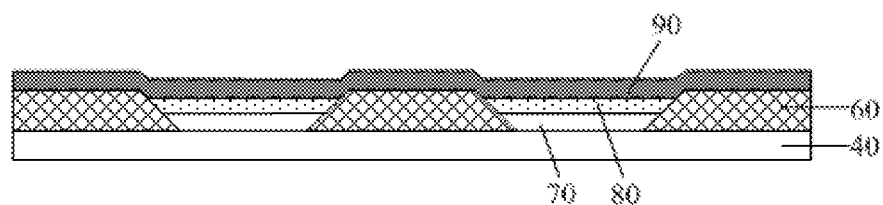
FIG. 7 is a first schematic structural view of a display substrate display area provided by an embodiment of the present disclosure.
Figure 8:
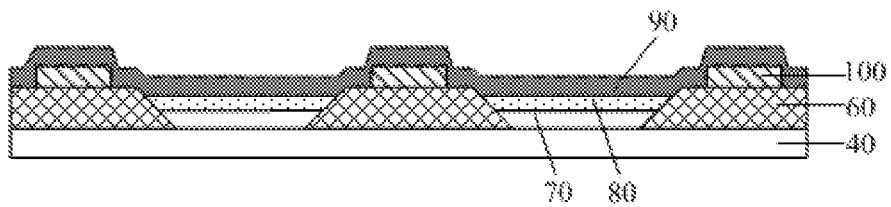
FIG. 8 is a second schematic structural view of a display substrate display area provided by an embodiment of the present disclosure.

As shown in FIG. 7 and FIG. 8, the display area 01 may include a pixel defining layer (PDL) 60 disposed on the base substrate 40, a first electrode 70, a light emitting layer 80, and a second electrode 90 covering the display area 01 disposed in sequence in the opening of the pixel defining layer 60, the first conductive pattern 10 and the first electrode 70 are disposed in the same layer, and the second conductive pattern 30 and the second electrode 90 are disposed in the same layer. In the present disclosure, "disposed in the same layer" means being formed by the same film layer.

In the display substrate, the first electrode 70 may be an anode, the second electrode 90 may be a cathode, or the first electrode 70 may be a cathode, and the second electrode 90 may be an anode. The second electrode 90 can form a fully-covering evaporated film layer using an open mask.

In addition, the light emitted from the light emitting layer 80 may be emitted from the first electrode 70 or emitted from the second electrode 90. Of course, the light may be emitted from the first electrode 70 and the second electrode 90. The materials of the first electrode 70 and the second electrode 90 are not limited. When the light emitted from the light emitting layer 80 is emitted from the first electrode 70, i.e., the first electrode 70 is a transmissive electrode, the material of the first electrode 70 may include at least one of ITO (Indium Tin Oxide), IZO (Indium Zinc Oxide), or FTO (Fluorine-Doped Tin Oxide), when the light emitted from the light emitting layer 80 is not emitted from the first electrode 70, the first electrode 70 is a reflective electrode and the material of the first electrode 70 may include one or more of Ag (silver), Mg (magnesium), Al (aluminum), Pt (platinum), Au (gold), or their compounds. The second electrode 90 may be similar to the first electrode 70 described above and will not be described here.

Here, it should be noted that other lines, thin film transistors, and the like may also be disposed between the base substrate 40 and the first electrode 70. An electron transport layer, an electron injection layer, a hole transport layer, a hole injection layer, and the like may also be disposed between the first electrode 70 and the second electrode 90.

In the fabricating process of the display substrate, for example, vapor deposing of the light-emitting layer is performed by vapor deposition using an FMM (Fine Metal Mask). Therefore, an alignment mark must be provided on the display substrate. The alignment mark may be an alignment mark for the FMM to detect PPA (pixel position accuracy).

In embodiments of the present disclosure, the first conductive pattern 10 and the first electrode 70 are disposed in the same layer, so that the first conductive pattern 10 can be formed at the same time as the first electrode 70 is formed. The second conductive pattern 30 and the second electrode 90 are in the same layer, thus, the second conductive pattern 30 can be fabricated simultaneously with the second electrode 90, thereby simplifying the manufacturing process of the display substrate.

The first insulating pattern 20 may be disposed in the same layer with the pixel defining layer 60.

In embodiments of the present disclosure, since the first insulating pattern 20 and the pixel defining layer 60 are disposed in the same layer, the first insulating pattern 20 may be fabricated simultaneously with the pixel defining layer 60, so as to simplify the manufacturing process of the display substrate.

As shown in FIG. 8, the display area 01 may further include a spacer 100 (Photo Spacer, referred to as PS) located between the pixel defining layer 60 and the second electrode 90, and disposed on the pixel defining layer 60. The first insulating pattern 20 is disposed in the same layer as the spacer 100.

The material of the spacer 100 and the material of the pixel defining layer 60 may be the same or may be different.

In embodiments of the present disclosure, since the first insulating pattern 20 and the spacer 100 are disposed in the same layer, the first insulating pattern 20 may be fabricated simultaneously with the spacer 100, so as to simplify the manufacturing process of the display substrate.

The insulating layer may further include the second insulating pattern 50, the second insulating pattern 50 is disposed in the same layer as the pixel defining layer 60.

Wherein, when the second insulating pattern 50 and the pixel defining layer 60 are disposed in the same layer, the first insulating pattern 20 may also be disposed in the same layer as the pixel defining layer 60, so that the first insulating pattern 20 and the second insulating pattern 50 can be simultaneously fabricated.

In embodiments of the present disclosure, since the second insulating pattern 50 and the pixel defining layer 60 are disposed in the same layer, the second insulating pattern 50 may be simultaneously fabricated when the pixel defining layer 60 is fabricated, so as to simplify the manufacturing process of the display substrate.

As shown in FIG. 8, the display area 01 may further include a spacer disposed between the pixel defining layer 60 and the second electrode 90 and disposed on the pixel defining layer 60. When the insulating layer further includes a second insulating pattern 50, the second insulating pattern 50 is disposed in the same layer as the spacer 100.

When the second insulating pattern 50 and the spacer 100 are disposed in the same layer, the first insulating pattern 20 may also be disposed in the same layer as the spacer 100 so that the first insulating pattern 20 and the second insulating pattern 50 can be simultaneously formed.

In embodiments of the present disclosure, since the second insulating pattern 50 and the spacer 100 are disposed in the same layer, the second insulating pattern 50 may be simultaneously fabricated when the spacer 100 is fabricated, so as to simplify the manufacturing process of the display substrate.

Embodiments of the present disclosure provide a display device including the display substrate described above.

Figure 10:
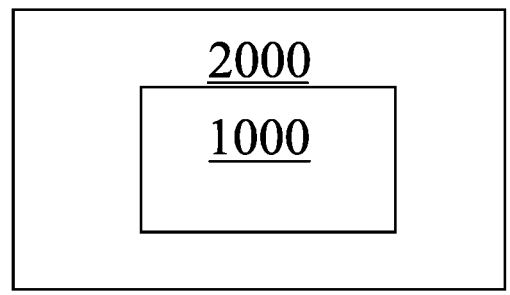
FIG. 10 is a schematic view of a display device according to an embodiment of the present disclosure.

FIG. 10 is a schematic view of a display device according to an embodiment of the present disclosure. As shown in FIG. 10, a display device 2000 according to an embodiment of the present disclosure includes a display substrate 1000 according to an embodiment of the present disclosure. The display substrate 1000 may be a display substrate as described above. For example, the display substrate 1000 may include the display substrates shown in FIGS. 3A, 3B, 3C, 3D, 4, 5, 6, 7, and 8.

The display device provided by embodiments of the present disclosure may be any device that displays an image regardless of whether it is in motion (for example, video) or fixed (for example, still image) and whether it is a text or a picture. More specifically, it is contemplated that embodiments may be implemented in or associated with a variety of electronic devices such as, but not limited to, mobile phones, wireless devices, personal data assistants (PDAs), hand-held or portable computer, GPS receiver/navigator, camera, MP4 video player, camera, game console, watch, clock, calculator, TV monitor, flat panel display, computer monitor, car display (e.g., odometer displays, etc.), navigators, cockpit controllers and/or monitors, displays of camera views (e.g., displays of rear-view cameras in vehicles), electronic photographs, electronic billboards or signs, projectors, building structures, packaging and an esthetic structure (for example, a display for an image of a piece of jewelry), etc. In addition, the display device may also be a display panel.

Here, the display device may be an LCD display device or an OLED display device.

An embodiment of the present disclosure provides a display device. The display device includes the above display substrate. The first insulating pattern 20 in the display substrate covers both the first hollow area 101 and the space between the adjacent first hollow areas 101. Since the first insulating pattern 20 of the peripheral area 02 does not completely cover the space between the adjacent first hollow areas 101 in embodiments of the present disclosure, the embodiments of the present disclosure may increase the contact area between the first conductive pattern 10 and the second conductive pattern 30, such that the contact resistance between the first conductive pattern 10 and the second conductive pattern 30 is reduced, the problem of non-uniform resistance due to the first insulating pattern 20 is reduced, and the voltage drop of the display substrate is reduced, solving optical defects, uneven brightness and other technical issues caused by the voltage drop.

Embodiments of the present disclosure also provide a method for manufacturing a display substrate. As shown in FIG. 1, the display substrate includes a display area 01 and a peripheral area 02 surrounding the display area 01. As shown in FIG. 9, the manufacturing method includes:

S100: Form a third conductive pattern on the base substrate 40. The third conductive pattern includes the first conductive pattern 10 located in the peripheral area 02, and the first conductive pattern 10 includes at least two first hollow areas 101. The first hollow area 101 is used as an alignment mark. Further, the third conductive pattern further includes a first electrode 70 located in the display area 01.

The shape of the first hollow area 101 on the first conductive pattern 10 is not limited. Since the first hollow area 101 is used as an alignment mark, the first hollow area 101 is generally set to the shape of a "+" or "−" symbol.

S101: Form a third insulating pattern on the third conductive pattern, the third insulating pattern including a first insulating pattern 20 in the peripheral area 02, the first insulating pattern 20 covering the first hollow area 101, and the first insulating pattern 20 is not completely cover the space between adjacent first hollow areas 101. Further, the third insulating pattern includes a pixel defining layer or a spacer located in the pixel defining area of the display area 01.

The first insulating pattern 20 does not completely cover the space between the adjacent first hollow areas 101. A portion of the first insulating pattern 20 located between the adjacent first open areas 101 may be hollow. The portions of first insulating pattern 20 located adjacent to the first hollow area 101 are disconnected from one another.

Here, the first insulating pattern 20 may be formed simultaneously with the pixel defining layer 60 of the display substrate, or may be formed simultaneously with the spacer 100 of the display substrate. If the first insulating pattern 20 and the pixel defining layer 60 are formed at the same time, a spacer 100 may also be formed on the pixel defining layer 60 after the third insulating pattern is formed. If the first insulating pattern 20 and the spacer 100 are simultaneously formed, then, the pixel defining layer 60 needs to be formed before the third insulating pattern is formed.

S102: Form a fourth conductive pattern on the third insulating pattern, the fourth conductive pattern including a second conductive pattern 30 located in the peripheral area 02, the second conductive pattern 30 is electrically connected to the first conductive pattern 10, and the second electrode 90 covers the display area 01 while the second conductive pattern 30 covers the first conductive pattern 10. Further, the fourth conductive pattern further includes a second electrode 90 located in the display area 01.

It should be noted that before the fourth conductive pattern is formed, the method further includes forming an organic layer in the opening region of the pixel defining layer 60, and the organic layer includes a light emitting layer 80.

The shapes of the first conductive pattern 10 and the second conductive pattern 30 may be the same or different. It is preferred in some embodiments of the present disclosure that the shapes of the first conductive pattern 10 and the second conductive pattern 30 are the same, and the second conductive pattern 30 covers the first conductive pattern 10.

Here, the first conductive pattern 10 and the second conductive pattern 30 are electrically connected so that the signals of the display area 01 can be derived layer by layer to transmit the signal of the display area 01 to the driver IC or other circuit of the peripheral area 02. Alternatively, when the display substrate is a COA substrate, the first conductive pattern 10 and the second conductive pattern 30 are electrically connected and can be used as part of a GOA circuit.

Embodiments of the present disclosure provide a method for manufacturing a display substrate. With respect to display substrate in the prior art wherein both the first hollow area 101 and the space between adjacent first hollow areas 101 are covered by the first insulating pattern 20, the first insulating pattern 20 of the peripheral area 02 of embodiments of the present disclosure does not completely cover the space between the adjacent first hollow areas 101, and thus the embodiments of the present disclosure can increase the contact area of the first conductive pattern 10 and the second conductive pattern 30 and reduce the contact resistance between the first conductive pattern 10 and the second conductive pattern 30. Thus, the problem of uneven local resistance due to the first insulating pattern 20 is reduced, and the voltage drop of the display substrate is reduced as well, solving optical defects, uneven brightness and other technical issues caused by voltage drop.

As shown in FIGS. 3A, 3C, 3D, and 6, the first insulating pattern 20 may have a zigzag shape.

Here, when the first insulating pattern 20 has a zigzag shape, one tooth covers one first hollow area 101. In addition, the zigzag teeth may face towards the display area 01 as shown in FIGS. 3A, 3C, and 6 or may face far away from the display area 01 as shown in FIG. 3D.

On this basis, when the shape of the first insulating pattern 20 is zigzag, the tips of the teeth may be dots (not shown in the drawings of the present disclosure), or may also be lines as shown in FIG. 3A, FIG. 3C, and FIG. 6.

In embodiments of the present disclosure, the first insulating pattern 20 covers the first hollow area 101. Since the shape of the first insulating pattern 20 is zigzag, when the second conductive pattern 30 is formed on the first insulating pattern 20, the contact area of the first conductive pattern 10 and the second conductive pattern 30 is increased.

As shown in FIG. 4 and FIG. 5 (the second conductive pattern 30 is not illustrated in FIG. 4 or FIG. 5), the first insulating pattern 20 may include a plurality of mutually independent sub-insulating patterns 201, wherein each sub-insulating pattern 201 covers a first hollow area 101.

The shape and size of the sub-insulating pattern 201 are not limited as long as each sub-insulating pattern 201 can cover a first hollow area 101. In order to make the contact area of the first conductive pattern 10 and the second conductive pattern 30 as large as possible, the sub-insulating pattern 201 should be as small as possible.

Here, each sub-insulating pattern 201 covers a first hollow area 101. As shown in FIG. 4, the boundary of the projection of the sub-insulating pattern 201 on the first conductive pattern 10 may envelop the boundary of the first hollow area 101. As shown in FIG. 5, the boundary of the sub-insulating pattern 201 projected on the first conductive pattern 10 may overlap with the boundary of the first hollow area 101.

In embodiments of the present disclosure, since the first insulating pattern 20 includes a plurality of mutually independent sub-insulating patterns 201, each sub-insulating pattern 201 covers one first hollow area 101, such that when the second conductive pattern 30 is formed on the first insulating patterns 20, the contact area of the first conductive pattern 10 and the second conductive pattern 30 can be increased.

In order to maximize the contact area between the first conductive pattern 10 and the second conductive pattern 30 and prevent the edges of the first hollow area 101 in the first conductive pattern 10 from being oxidized to a burr, in embodiments of the present disclosure, as shown in FIG. 5, the projection of the boundary of the sub-insulating pattern 201 on the first conductive pattern 10 may coincide with the boundary of the first hollow area 101. At this time, the shape and size of the sub-insulating pattern 201 are completely the same as the size and the shape of the first hollow area 101, and the sub-insulating pattern 201 is filled in the first hollow area 101.

Alternatively, as shown in FIG. 6, the first conductive pattern 10 may envelop the entire peripheral display area 01 along the display area 01.

In embodiments of the present disclosure, since the first conductive pattern 10 surrounds the display area 01 along the entire periphery of the display area 01, the area of the first conductive pattern 10 increases so that the first conductive pattern 10 and the second conductive pattern 30 are in contact and the voltage drop between the first conductive pattern 10 and the second conductive pattern 30 can be reduced.

The foregoing descriptions are merely specific implementation of the present disclosure, and the protection scope of the present disclosure is not limited thereto. Any change or alternatives, those skilled in the art may easily think of a change or amend, within the technical scope disclosed in the present disclosure, should all fall in the scope of this disclosure. Therefore, the protection scope of the present disclosure should be based on the protection scope of the claims.

What is claimed is:

1. A display substrate, comprising:
   a display area and a peripheral area surrounding the display area, wherein the peripheral area comprises:
   a first conductive pattern comprising at least two first hollow areas as alignment marks;
   an insulating layer disposed on the first conductive pattern, the insulating layer comprising a first insulating pattern, wherein the first insulating pattern covers the at least two first hollow areas, and wherein the first insulating pattern partially covers a space between the adjacent ones of the first hollow areas; and
   a second conductive pattern disposed on the insulating layer, the second conductive pattern electrically connected to the first conductive pattern.

2. The display substrate according to claim 1, wherein the first insulating pattern has a zigzag shape.

3. The display substrate according to claim 1, wherein the first insulating pattern comprises a plurality of mutually independent sub-insulating patterns, and wherein each of the sub-insulating patterns covers one of the first hollow areas.

4. The display substrate according to claim 3, wherein a projection of a boundary of the sub-insulating patterns on the first conductive pattern overlaps with a boundary of the first hollow areas.

5. The display substrate according to claim 1, wherein the first conductive pattern surrounds the display area along an entire periphery of the display area.

6. The display substrate according to claim 1, wherein the first conductive pattern further comprises a second hollow area, wherein the second hollow area and the at least two first hollow areas are located on different sides of the display area, wherein the insulating layer further comprises a second insulating pattern, and wherein the second insulating pattern covers the second hollow area.

7. The display substrate according to claim 1, wherein the display area comprises a pixel defining layer disposed on a base substrate, a first electrode, a light emitting layer, and a second electrode covering the display area disposed in sequence in an opening of the pixel defining layer; and
   wherein the first conductive pattern is disposed in a same layer as the first electrode, and the second conductive pattern is disposed in a same layer as the second electrode.

8. The display substrate according to claim 7, wherein the first insulating pattern is disposed in a same layer as the pixel defining layer.

9. The display substrate according to claim 7, wherein the display area further comprises a spacer disposed on the pixel defining layer and disposed between the pixel defining layer and the second electrode; and
   wherein the first insulating pattern is disposed in a same layer as the spacer.

10. The display substrate according to claim 7, wherein the insulating layer further comprises a second insulating pattern, the second insulating pattern disposed in a same layer as the pixel defining layer.

11. The display substrate according to claim 10, wherein the display area further comprises a spacer, the spacer located between the pixel defining layer and the second electrode.

12. The display substrate according to claim 7, wherein the display area further comprises a spacer, the spacer located between the pixel defining layer and the second electrode.

13. A display device comprising the display substrate according to claim 1.

14. A display device comprising the display substrate according to claim 2.

15. A display device comprising the display substrate according to claim 3.

16. A display device comprising the display substrate according to claim 4.

* * * * *

UNITED STATES PATENT AND TRADEMARK OFFICE
CERTIFICATE OF CORRECTION

PATENT NO. : 10,777,635 B2
APPLICATION NO. : 15/777704
DATED : September 15, 2020
INVENTOR(S) : Fan Yang et al.

Page 1 of 1

It is certified that error appears in the above-identified patent and that said Letters Patent is hereby corrected as shown below:

In the Specification

Column 10, Line 25, delete "5102: Form" and insert therefor -- S102: Form --

Signed and Sealed this
Twenty-seventh Day of October, 2020

Andrei Iancu
*Director of the United States Patent and Trademark Office*